US010522288B2

(12) United States Patent
Umeda et al.

(10) Patent No.: US 10,522,288 B2
(45) Date of Patent: Dec. 31, 2019

(54) POLYCRYSTALLINE DIELECTRIC THIN FILM AND CAPACITANCE ELEMENT

(71) Applicant: TDK CORPORATION, Tokyo (JP)

(72) Inventors: Yuji Umeda, Tokyo (JP); Kumiko Yamazaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/938,730

(22) Filed: Mar. 28, 2018

(65) Prior Publication Data

US 2018/0286585 A1 Oct. 4, 2018

(30) Foreign Application Priority Data

Mar. 31, 2017 (JP) ................. 2017-071084
Jan. 30, 2018 (JP) ................. 2018-013715

(51) Int. Cl.
*C04B 35/64* (2006.01)
*H01G 4/12* (2006.01)
(Continued)

(52) U.S. Cl.
CPC ......... *H01G 4/1254* (2013.01); *C04B 35/495* (2013.01); *C04B 35/6262* (2013.01);
(Continued)

(58) Field of Classification Search
CPC . C04B 35/58007; C04B 35/495; C04B 35/46; C04B 35/62655; C04B 35/64; C04B 35/634; C04B 35/6262; C04B 35/6264; C04B 35/62218; C04B 2235/768; C04B 2235/6886; C04B 2235/602; C04B 2235/612; C04B 2235/656; H01G 4/33;
(Continued)

(56) References Cited

U.S. PATENT DOCUMENTS

| 4,734,390 A * | 3/1988 | Marchand ........... C01B 21/0821 |
| | | 501/96.1 |
| 2013/0003254 A1 | 1/2013 | Koutsaroff et al. |
| 2015/0228408 A1 | 8/2015 | Koutsaroff et al. |

FOREIGN PATENT DOCUMENTS

| CN | 102858691 A | 1/2013 |
| JP | 2001-220300 A | 8/2001 |

OTHER PUBLICATIONS

Le Paven et al. Growth of (Sr,La)—(Ta,Ti)—O—N perovskite oxide and oxynitride films by radio frequency magnetron sputtering: Influence of the reactive atmosphere on the film structure. Journal of Crystal Growth, Elsevier, 2015, 413, pp. 5-11.*

(Continued)

*Primary Examiner* — Noah S Wiese
(74) *Attorney, Agent, or Firm* — Oliff PLC

(57) ABSTRACT

A polycrystalline dielectric thin film including a main component made of an oxynitride expressed by a general formula of $(M(1)_{1-x}M(2)_x)(M(3)_{1-y}M(4)_y)(O_{1-z}N_z)_3$. $0 \leq x \leq 1$, $0 \leq y \leq 1$, and $0 < z < 1/3$ are satisfied. A total sum of nominal valences of M(1), M(2), M(3), and M(4) is 14. A crystal structure of the oxynitride includes an octahedron structure including a center atom, two 4a site atoms, and four 8h site atoms. The center atom is M(3) or M(4). The 4a site atom is O atom or N atom. The 8h site atom is O atom or N atom. An angle θ formed between a straight line connecting two 4a site atoms and a c-axis direction of the crystal structure in the octahedron structure satisfies $0.5° \leq \theta \leq 12°$.

2 Claims, 6 Drawing Sheets

(51) Int. Cl.
  *C04B 35/495* (2006.01)
  *C04B 35/626* (2006.01)
  *C04B 35/634* (2006.01)

(52) U.S. Cl.
  CPC .... *C04B 35/6264* (2013.01); *C04B 35/62655* (2013.01); *C04B 35/63416* (2013.01); *C04B 35/64* (2013.01); *C04B 2235/3895* (2013.01); *C04B 2235/602* (2013.01); *C04B 2235/606* (2013.01); *C04B 2235/6567* (2013.01)

(58) Field of Classification Search
  CPC ...... H01G 4/85; H01G 4/1218; H01G 4/1272; H01B 3/10
  See application file for complete search history.

(56) References Cited

OTHER PUBLICATIONS

Kim et al. Characterization of the Structural, Optical, and Dielectric Properties of Oxynitride Perovskites AMO2N (A=Ba, Sr, Ca; M=Ta, Nb). Chem. Mater. 2004, 16, 1267-1276.*

Le Paven, C. et al., "Growth of (Sr,La)—(Ta,Ti)—O—N Perovskite Oxide and Oxynitride Films by Radio Frequency Magnetron Sputtering: Influence of the Reactive Atmosphere on the Film Structure," Journal of Crystal Growth, vol. 413, pp. 5-11, Mar. 1, 2015.

Kim, Young-Il, et al., "Characterization of the Structural, Optical, and Dielectric Properties of Oxynitride Perovskites AMO2N (A=Ba,Sr,Ca; M=Ta,Nb)," Chem. Mater., vol. 16, No. 7, pp. 1267-1276, Apr. 1, 2004.

* cited by examiner

POLYCRYSTALLINE DIELECTRIC THIN FILM AND CAPACITANCE ELEMENT

BACKGROUND OF THE INVENTION

1. Field of the Invention

The present invention relates to a polycrystalline dielectric thin film and a capacitance element.

2. Description of the Related Art

Recently, a faster speed and higher capacitance are demanded for a wireless communication device such as a smart phone. Many ceramic capacitors are used for IC part of the smart phone. However, the ceramic capacitor cannot maintain a dielectric property when a voltage having a resonance frequency or more is applied. Therefore, the capacitor which can correspond to a higher frequency is demanded.

In order to obtain the capacitor which can correspond to a high frequency, generally a capacitance of the capacitor needs to be improved. Further, the capacitor has a smaller size and a larger capacity by thinning and stacking a dielectric layer of the capacitor. In order to attain a thinned and multilayered capacitor, a sheet method has been widely used conventionally. However, there is a limit to the thinning of the dielectric layer made by the sheet method.

Patent document 1 discloses a thin film capacitor having a super lattice structure stacking $BaTiO_3$ epitaxial film and $SrTiO_3$ epitaxial film in an alternating manner. However, the thin film capacitor disclosed in the patent document 1 needs a special single crystal substrate in order to carry out the epitaxial growth, thus an industrial use is difficult.

[Patent document 1] JP Patent Application Laid Open No. 2001-220300

SUMMARY OF THE INVENTION

The present invention is attainted in view of such circumstances, and the object is to provide the polycrystalline dielectric thin film and the capacitance element having high specific permittivity.

The polycrystalline dielectric thin film according to the first aspect of the present invention is a polycrystalline dielectric thin film having a main component made of an oxynitride expressed by a general formula of $(M(1)_{1-x}M(2)_x)(M(3)_{1-y}M(4)_y)(O_{1-z}N_z)_3$, wherein $0 \leq x \leq 1$, $0 \leq y \leq 1$, and $0 < z < 1/3$ are satisfied, a total sum of nominal valences of M(1), M(2), M(3), and M(4) is 14, a crystal structure of said oxynitride includes an octahedron structure comprised of a center atom, two 4a site atoms, and four 8h site atoms, said center atom is M(3) or M(4),
said 4a site atom is O atom or N atom,
said 8h site atom is O atom or N atom, and
an angle θ formed between a straight line connecting two 4a site atoms and a c-axis direction of said crystal structure in said octahedron structure satisfies $0.5° \leq θ \leq 12°$.

The polycrystalline dielectric thin film according to the second aspect of the present invention is a polycrystalline dielectric thin film having a main component made of an oxynitride expressed by a general formula of $(Sr_{1-x}Ba_x)(Ta_{1-y}Nb_y)(O_{1-z}N_z)_3$, wherein $0 \leq x \leq 1$, $0 \leq y \leq 1$, and $0 < z \leq 0.333$ are satisfied,
said oxynitride is a perovskite type oxynitride, a crystal structure of said perovskite type oxynitride includes an octahedron structure comprised of a center atom, two 4a site atoms, and four 8h site atoms, said center atom is Ta or Nb,
said 4a site atom is O atom or N atom,
said 8h site atom is O atom or N atom, and
an angle θ formed between a straight line connecting two 4a site atoms and a c-axis direction of said crystal structure in said octahedron structure satisfies $0.5° \leq θ \leq 12°$.

The polycrystalline dielectric thin film according to the third aspect of the present invention is a polycrystalline dielectric thin film having a main component made of an oxynitride expressed by a general formula of $(Sr_{1-x}Ba_x)(Ta_{1-y}Nb_y)(O_{1-z}N_z)_3$, wherein $0.02 \leq x \leq 0.8$, $0 \leq y \leq 0.4$, and $0.033 \leq z \leq 0.233$ are satisfied, and said oxynitride is a perovskite type oxynitride.

The polycrystalline dielectric thin film according to the present invention has the above mentioned characteristics, thereby attains extremely high specific permittivity of several thousands to several millions or larger when a frequency is around 1 MHz.

Also, the capacitance element according to the present invention has the polycrystalline dielectric thin film according to said first to third aspects of the invention.

DESCRIPTION OF THE PREFERRED EMBODIMENTS

Hereinafter, the present invention will be described based on each embodiment.

First Embodiment

Figure 1:
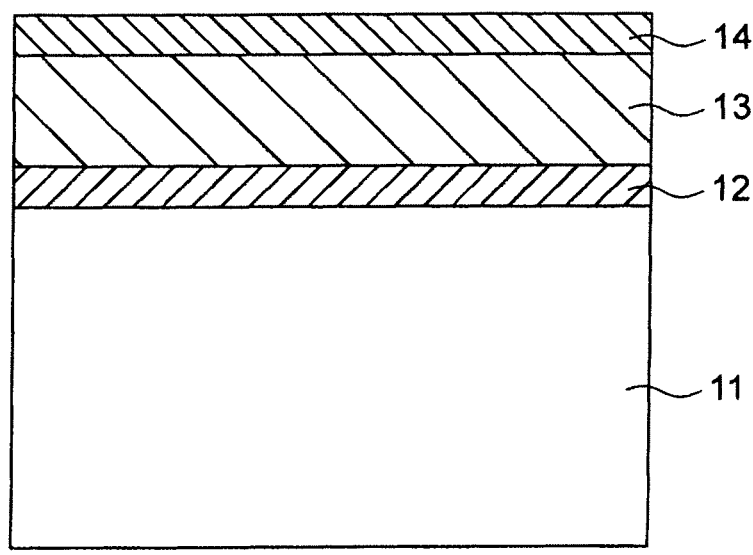
FIG. 1 is a schematic diagram of a thin film capacitor according to an embodiment of the present invention.

A schematic diagram of the thin film capacitor according to the present embodiment is shown in FIG. 1. The thin film capacitor 1 shown in FIG. 1 has a lower electrode 12 and a polycrystalline dielectric thin film 13 on a substrate 11 in this order, and also has an upper electrode 14 on the surface of the polycrystalline dielectric thin film 13.

The material of the substrate 11 is not particularly limited, but Si single crystal is used as the substrate 11 because of the cost and because it is easy to obtain. In case flexibility is important, Ni foil or Cu foil can be used as the substrate.

The material of the lower electrode 12 and the upper electrode 14 are not particularly limited as long as these function as the electrode. For example, Pt, Ag, and Ni or so may be mentioned. The thickness of the lower electrode 12 is preferably 0.01 to 10 μm. The thickness of the upper electrode 14 is preferably 0.01 to 10 μm.

The polycrystalline dielectric layer has the main component made of the oxynitride expressed by a general formula of $(M(1)_{1-x}M(2)_x)(M(3)_{1-y}M(4)_y)(O_{1-z}N_z)_3$. Also, $0 \leq x \leq 1$, $0 \leq y \leq 1$, and $0 < z < \frac{1}{3}$ are satisfied. Note that, a total sum of nominal valences of M(1), M(2), M(3), and M(4) is 14.

Types of M(1) and M(2) are not particularly limited, for example it may be one selected from the group consisting of Sr, Ba, Ca, La, Ce, Pr, Nd, and Na or so. Further, preferably M(1) is Sr and M(2) is Ba.

Types of M(3) and M(4) are not particularly limited, and for example it is selected from the group consisting of Ta, Nb, Ti, and W. Further, preferably M(3) is Ta and M(4) is Nb.

Figure 2:
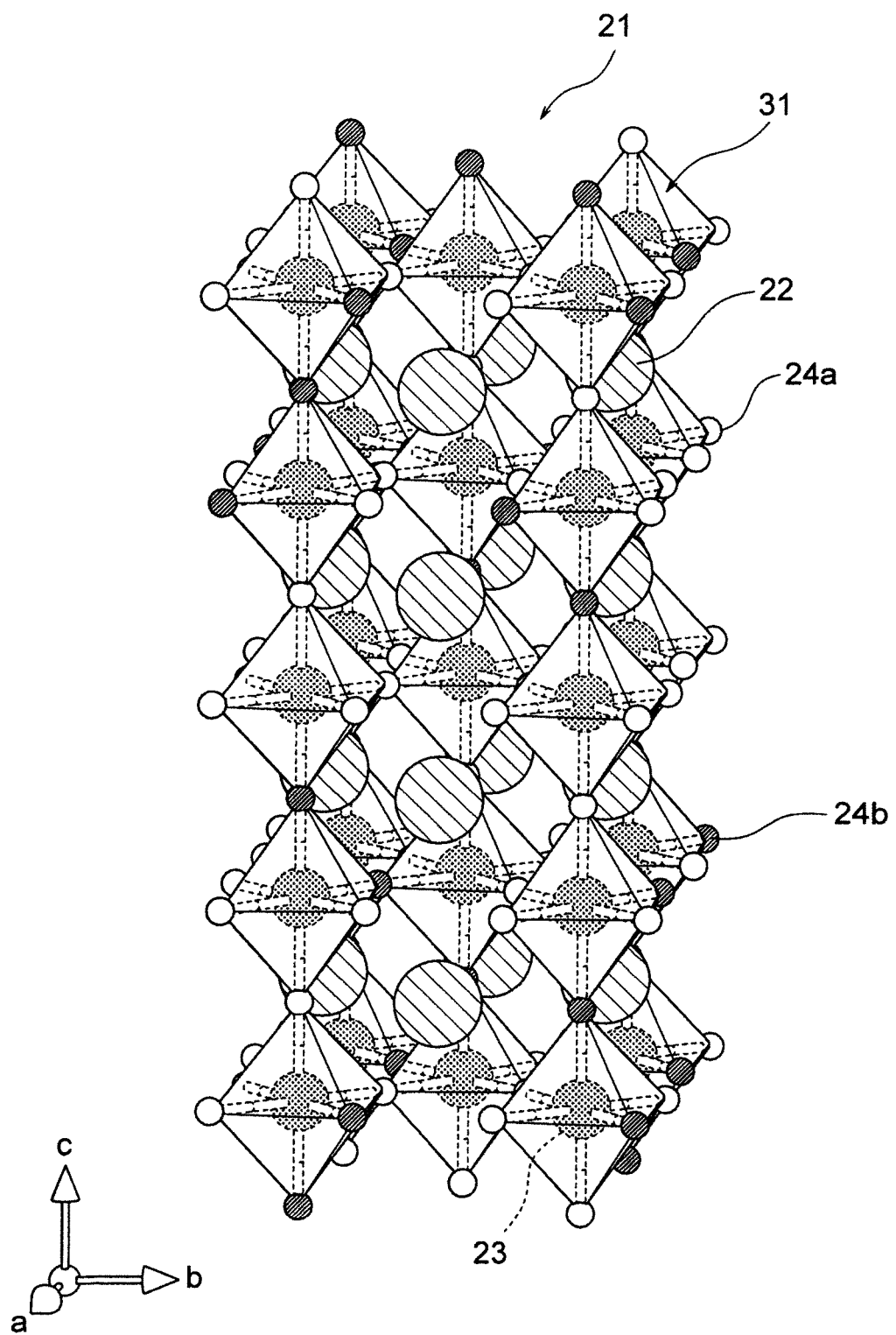
FIG. 2 shows a figure of the crystal structure of $SrTaO_2N$.

As an example of a compound of which the main composition is expressed by $(M(1)_{1-x}M(2)_x)(M(3)_{1-y}M(4)_y)(O_{1-z}N_z)_3$, $SrTaO_2N$ compound 21 shown in FIG. 2 may be mentioned (specifically, M(1)=Sr, M(3)=Ta, x=0, y=0, and z=⅓). In $SrTaO_2N$ compound 21, the octahedron structure 31 exist continuously, in which Ta atom 23 is the center atom, and O atom 24a or N atom 24b is two 4a site atoms and four 8h site atoms. Note that, Sr atom 22 exists at outer part of the octahedron structure 31. Note that, the compound according to the present embodiment is a compound having larger ratio of O and smaller ratio of N than $SrTaO_2N$ shown in FIG. 2. Preferably, it is a perovskite type oxynitride having $0 \leq x \leq 1$, $0 \leq y \leq 1$, and $0 < z \leq 0.333$.

Figure 3:
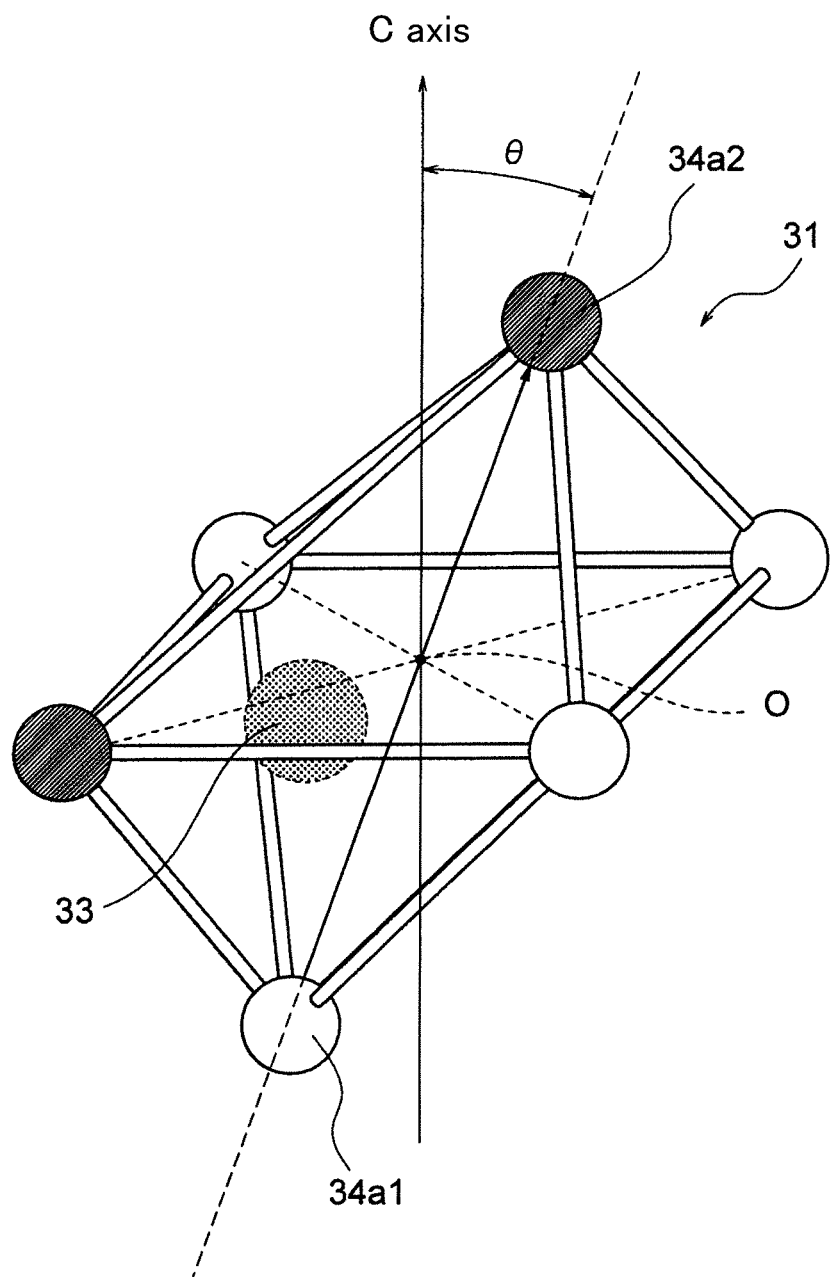
FIG. 3 shows an octahedron structure of an oxynitride.

Here, regarding the oxynitride according to the present embodiment having the main component expressed by $(M(1)_{1-x}M(2)_x)(M(3)_{1-y}M(4)_y)(O_{1-z}N_z)_3$, and satisfying $0 \leq x \leq 1$, $0 \leq y \leq 1$, and $0 < z < \frac{1}{3}$, the position of a center atom 33 (Ta atom 23 of FIG. 2) is slightly shifted from a center point 0 of the octahedron structure as shown in FIG. 3. Further, the straight line connecting two 4a site atoms (4a site O atom 34a1 and 4a site N atom 34a2) is tilted from the c-axis by an angle θ. Note that, the case of which the 4a site atom is O atom and N atom is shown in FIG. 3, however the octahedron structure wherein two 4a site atoms are both O atom may be partially included.

Also, generally, when the main component is the oxynitride expressed by $(M(1)_{1-x}M(2)_x)(M(3)_{1-y}M(4)_y)(O_{1-z}N_z)_3$, depending on types of M(1) to M(4) and values of x, y, and z, the degree of position shifting of M(3) and M(4) from the center of the octahedron structure changes. Further, the angle θ of the straight line connecting two 4a site atoms tilting from the c-axis is changed.

The oxynitride according to the present embodiment has $0.5° \leq θ \leq 12°$. In case the angle θ is within the above mentioned range, the specific permittivity is significantly improved when the frequency is high such as around 1 MHz. Also, the angle θ is preferably $1.8° \leq θ \leq 12°$, more preferably $4.6° \leq θ \leq 12°$, and most preferably $6.5° \leq θ \leq 12°$.

The angle θ can be obtained relatively easily and with high accuracy by the calculation method called the first principles calculations.

As one method of the first principles calculations, there is a calculation method called PAW (Projector Augmented-Wave) method. This method allows the more accurate and shorter calculation among the methods of the first principle calculation. Also, the crystal structure optimization can be calculated by preparing the potential of each atom constituting a unit lattice or so in advance to carry out the electronic state calculation.

Also, in order to calculate a mutual reaction between many electrons present in the crystal, the calculation method called a density functional method is used. As one of the approximation method using the density functional method, there is a method called GGA (Generalized Gradient Approximation) method. By using the GGA method, the electron state can be accurately calculated.

There is a package program called VASP (the Vienna Ab-initio Simulation Package) as the first principles calculations package program including the above mentioned PAW method and GGA method. The first principles calculations of the present embodiment and the examples described in below is carried out by using this VASP.

The oxynitride of M(1)=Sr, M(2)=Ba, M(3)=Ta, and M(4)=Nb, that is the perovskite type oxynitride expressed by $(Sr_{1-x}Ba_x)(Ta_{1-y}Nb_y)(O_{1-z}N_z)_3$ is the oxynitride having the octahedron structure wherein Ta or Nb is the center atom, and total of six O or N are present as two 4a site atoms or four 8h site atoms. Here, it is known that regarding the four 8h site atoms, one to two are N, and rest of two to three are O among four atoms.

When the first principles calculations was carried out to said perovskite type oxynitride, as shown in FIG. 3, Ta atom or Nb atom, which is the center atom 33, is energetically stable at the position shifted from the center point 0 of the octahedron structure. Further, the straight line connecting two 4a site of said octahedron structure is tilted from the c-axis direction of the crystalline by the angle θ. The present inventors have found that the angle θ can be changed by changing types of M(1) to M(4) and values of x, y, and z which are the ratio of content of each element. Further, the present inventors have found that the larger the θ is, the higher the specific permittivity of oxynitride $(M(1)_{1-x}M(2)_x)(M(3)_{1-y}M(4)_y)(O_{1-z}N_z)_3$ becomes. Note that, the specific permittivity becomes higher when θ satisfies $0.5° \leq θ \leq 12°$. This effect is more prominent for the specific permittivity at the high frequency of about 1 MHz.

The phenomenon of the specific permittivity increasing in case the oxynitride is the octahedron structure 31 shown in FIG. 3 is thought to be caused by three causes which are (I) an ionic polarization, (II) a dipole polarization by the rotation of the straight line connecting two 4a site atoms (the rotation of the octahedron structure), and (III) a dipole polarization caused by the change of the direction of the straight line connecting two 4a site atoms against the c-axis.

For example, in case of $SrTaO_2N$, (I) the ionic polarization is the polarization caused by the relative shifting of the position of Ta ion as a cation and the position of the center point 0 of four O ions and two N ion as anions. As the polarization is generated, the specific permittivity is thought to be improved. According to the first principles calculations, width of improvement of the specific permittivity due to the improvement of said ionic polarization is 443 in case the frequency is 1 MHz.

For example, in case of $SrTaO_2N$, (II) the dipole polarization by the rotation of the straight line connecting two 4a site atoms is the dipole polarization caused by the rotation of the straight line connecting two 4a site atoms. As said dipole polarization is generated, the specific permittivity is thought to be improved. The change in the specific permittivity due to the rotation is calculated from the below equation (1).

[Equation 1]

$$\varepsilon_0(\varepsilon_r - 1) = \frac{P}{E} = \frac{1}{E}\frac{\sum_i p_i}{V} = \frac{1}{E}\frac{\sum_i Z_i e l_i}{V} \Rightarrow \varepsilon_0 \Delta \varepsilon_r \sim \frac{\Delta P}{E} = \frac{1}{E}\frac{\sum_i \Delta p_i}{V} = \frac{1}{E}\frac{\sum_i Z_i e \Delta l_i}{V} \quad (1)$$

In case of (II), $\varepsilon_0$ of the equation (1) is the permittivity in vacuum, $\varepsilon_r$ is the specific permittivity, P and p are the degree of polarization, E is a rated voltage ¼ (E=1 V/μm), V is the volume of calculation model by the first principles calculations (V=528.15 Å³), Z is difference of an electric charge between O and N (Z=2), l is the distance between O—N (l=4.0787 Å), i=2 (polarization number in said volume), and e=1.60218×10⁻¹⁹ C.

Figure 4:
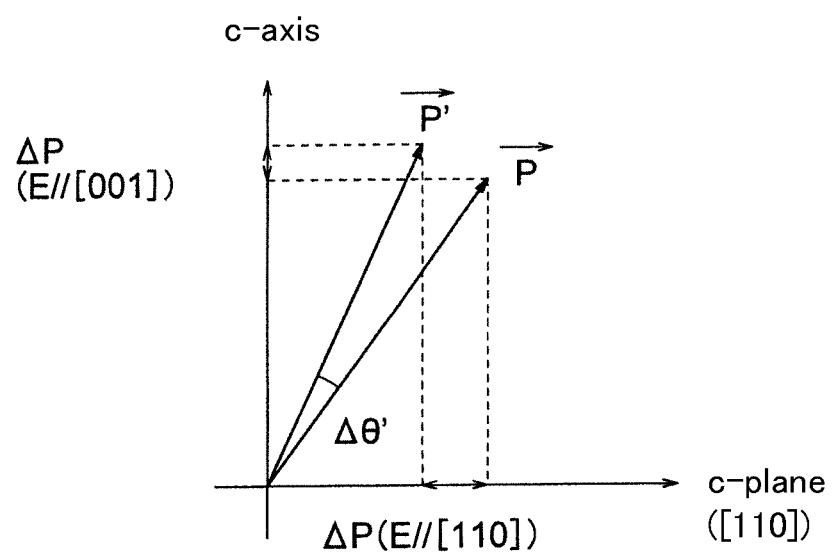
FIG. 4 is a graph showing a change ΔP of a degree of polarization.
Figure 5:
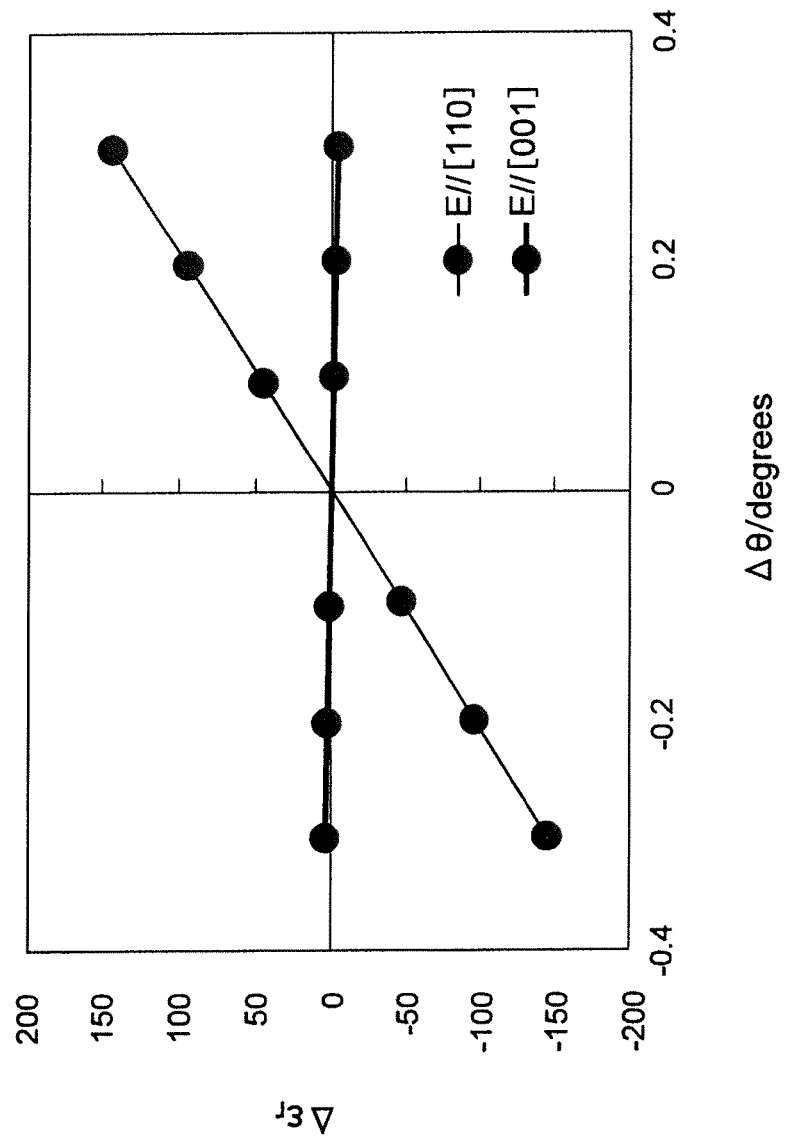
FIG. 5 is a graph showing a change of a specific permittivity due to a rotation of a straight line connecting two 4a site atoms.

Here, FIG. 4 shows ΔP (the change of the degree of polarization) of (II). Further, FIG. 5 is a graph showing the relation between degree of Δθ' of FIG. 4 calculated based on the first principles calculations and width of improvement of the specific permittivity changed. FIG. 5 and FIG. 4 are graphs which can be derived from the equation (1).

As discussed in above, the specific permittivity improves by the rotation of the straight line connecting two 4a site atoms, however the change $\Delta\varepsilon_r$ of the specific permittivity which increases by the rotation of the straight line is several tens to several hundred or so when the frequency is 1 MHz.

For example, in case of $SrTaO_2N$, the specific permittivity is thought to change (III) the dipole polarization caused by the change of the direction of the straight line connecting two 4a site atoms against the c-axis. The change in the direction changes as the position of N atom and O atom differs in each octahedron. The specific permittivity changes caused by the change of the direction can be calculated from the following equation (1).

[Equation 1]

$$\varepsilon_0(\varepsilon_r - 1) = \frac{P}{E} = \frac{1}{E}\frac{\sum_i p_i}{V} = \frac{1}{E}\frac{\sum_i Z_i e l_i}{V} \Rightarrow \varepsilon_0 \Delta\varepsilon_r \sim \frac{\Delta P}{E} = \frac{1}{E}\frac{\sum_i \Delta p_i}{V} = \frac{1}{E}\frac{\sum_i Z_i e \Delta l_i}{V} \quad (1)$$

Figure 6:
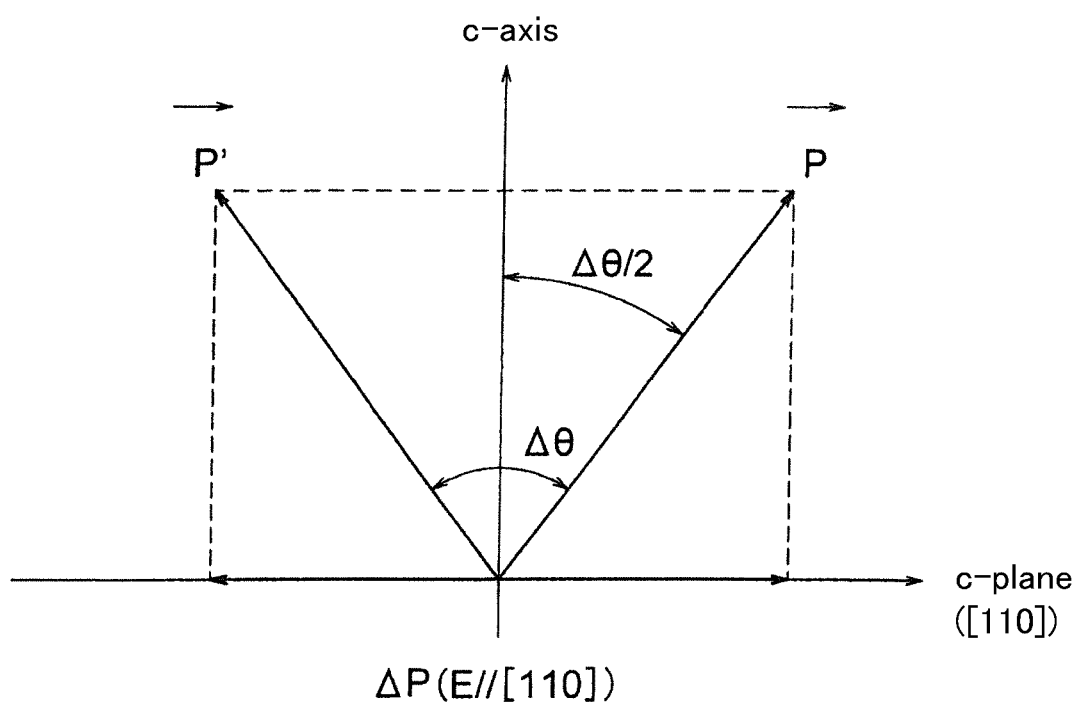
FIG. 6 is a graph showing a change ΔP of a degree of polarization.

In case of (III), $\varepsilon_0$ of the equation (1) is the permittivity in vacuum, $\varepsilon_r$ is the specific permittivity, P and p are the degree of polarization, E is a rated voltage ¼ (E=1 V/μm), V is the volume of the calculation model by the first principle calculation (V=528.15 Å³), Z is the difference of electric charge between O and N (Z=2), l is the distance between O—N (l=4.0787 Å), i=2 (the polarization number in said volume), and e=1.60218×10⁻¹⁹ C. In order to simplify, FIG. 6 is a figure showing ΔP (the change of the degree of polarization) of (III) when the direction of the straight line connecting two 4a site atoms is symmetrically changing against the c-axis.

As discussed in above, the specific permittivity improves by changing the direction of the straight line connecting two 4a site atoms against the c-axis. When the change $\Delta\varepsilon_r$ of the specific permittivity caused by the change of the direction is calculated form Δθ, it is several thousand or so when the frequency is 1 MHz. Note that, Δθ/2 of FIG. 6 is θ of FIG. 3. That is, Δθ of FIG. 6 is 2θ.

As discussed in above, the present inventors have found that the effect of improving the specific permittivity of the oxynitride expressed by $(M(1)_{1-x}M(2)_x)(M(3)_{1-y}M(4)_y)(O_{1-z}N_z)_3$ is mainly caused by (III) the change in the direction of the straight line connecting two 4a site atoms against the c-axis. Further, the present inventors have found that the degree of the effect of the improvement of the specific permittivity caused by the change in the direction of the straight line connecting two 4a site atoms against the c-axis is determined based on the degree of the angle θ. By forming the polycrystalline thin film having the above mentioned composition, the specific permittivity of several thousand can be obtained.

The polycrystalline dielectric thin film 13 is one type of a polycrystalline film, and also one type of a dielectric film. The thickness of the polycrystalline dielectric thin film 13 is not particularly limited, and preferably 10 nm to 1 μm.

Production Method of the Thin Film Capacitor 1

Next, the production method of the thin film capacitor 1 will be explained. Hereinafter, the case of which M(1)=Sr, M(3)=Ta, and x=y=0 will be discussed as an example. However, the same applies to the case using other atoms as M(1) to M(4), and changing x, y, and/or z.

The film forming method for forming the thin film as the polycrystalline dielectric thin film 13 at the end is not particularly limited. For example, a vacuum deposition method, a sputtering method, PLD method (Pulse Laser Deposition method), MO-CVD method (Metal Organic Chemical Vapor Deposition method), MOD method (Metal Organic Decomposition method), a sol-gel method, and CSD method (Chemical Solution Deposition method) or so may be mentioned. Also, trace amounts of impurities and sub components may be included in the material when forming the film; however it is not a problem as long as it is an amount which does not significantly compromise the property of the thin film. Also, the polycrystalline dielectric thin film 13 according to the present embodiment may include trace amounts of impurities and sub components as long as these do not significantly compromise the property.

Among the method of forming the film, when the film is formed by PLD method, the sputtering method, and CSD method or so, the thin film obtained at the end is likely to be a polycrystalline film. Also, if the polycrystalline dielectric thin film 13 according to the present embodiment is formed by PLD method, the sputtering method, and CSD method or so, the structure tends to have N at cis position. It may be made by CVD method, but because many elements are included, PLD method and the sputtering method or so have higher composition control property. In the present embodiment, the film forming method using PLD method will be described.

First, Si single crystal substrate as the substrate 11 is prepared. Next, $SiO_2$, $TiO_x$, and Pt are formed in this order on Si single crystal substrate, and the lower electrode 12 made of Pt is formed. The method of forming the lower electrode 12 is not particularly limited. For example, the spattering method and CVD method or so may be mentioned.

Next, the metal oxide thin film is formed on the lower electrode 12 by PLD method. Also, in order to expose part of the lower electrode 12, an area without the thin film is formed using a metal mask.

In PLD method, first, a target including the constituting elements of the polycrystalline dielectric thin film of the object is placed in the film forming chamber. Next, a pulse laser is irradiated on the surface of the target. Due to the strong energy of the pulse laser, the surface of the target is instantly evaporated. Then, the evaporated substance is deposited on the substrate which is placed by facing towards the target, thereby the metal oxide thin film is formed.

The type of the target is not particularly limited, other than the metal oxide sintered body including the constituting elements of the polycrystalline dielectric thin film to be produced, an alloy, a nitride sintered body, a metal oxynitride sintered body or so can be used. Also, for the target, preferably each element is distributed evenly, but the distribution may be uneven as long as the quality of the obtained polycrystalline dielectric thin film is not affected. Further, the target does not necessarily have to be one, and plurality of targets including part of the constituting elements of the polycrystalline dielectric thin film may be prepared and can be used for forming the film. The shape of the target is not particularly limited as well, and the shape may be that appropriate for the film forming device being used.

Also, for PLD method, when forming the film, the substrate 11 is preferably heated by an infrared laser in order to crystalize the metal oxide thin film. A heating temperature of the substrate 11 differs depending on the constituting element and the composition of the metal oxide thin film and the substrate 11, but for example the film is formed by heating at 600 to 800° C. By making the temperature of the substrate 11 to an appropriate temperature, the metal oxynitride thin film tends to easily crystalize, and the cracking generated while cooling can be prevented.

While forming the film, by carrying out a nitriding treatment by introducing a nitrogen radical, the polycrystalline dielectric thin film 13 made of perovskite type oxynitride can be obtained. As the method of nitriding treatment, for example, the method of carrying out the nitriding treatment by introducing the nitrogen radical after forming the metal oxide film, and the method of introducing the nitrogen radical while forming the film may be mentioned. Further, by controlling the amount of the nitrogen radical, the amount of the nitrogen in the thin film which has been formed can be changed, and z can be changed. Here, the amount of nitrogen in the thin film which has been formed can be verified by X-ray photoelectron spectroscopy. Regarding the quantification of nitrogen, the internal standard of the X-ray photoelectron spectroscopy apparatus can be used, but preferably a sensitivity factor is calculated from the nitride single crystal wafer such AlN or so, and the quantified value is corrected.

Lastly, by forming the upper electrode 14 on the polycrystalline dielectric thin film 13, the thin film capacitor 1 can be produced. Note that, the material of the upper electrode 14 is not particularly limited, and Ag, Au, and Cu or so can be used. Also, the method of forming the upper electrode 14 is not particularly limited as well. For example, it can be formed by evaporation and the spattering method or so.

Second Embodiment

The shape of the thin film capacitor according to the present embodiment is same as the first embodiment. The material of the substrate 11, the lower electrode 12, and the upper electrode 14 are same as the first embodiment. Further, the thickness of the lower electrode 12 is same as the first embodiment.

The polycrystalline dielectric thin film 13 comprises a main component made of an oxynitride expressed by a general formula of $(Sr_{1-x}Ba_x)(Ta_{1-y}Nb_y)(O_{1-z}N_z)_3$, and $0.02 \leq x \leq 0.8$, $0 \leq y \leq 0.4$, and $0.033 \leq z \leq 0.233$ are satisfied. Further, said oxynitride is the perovskite type oxynitride.

The polycrystalline dielectric thin film 13 according to the present embodiment can significantly improve the specific permittivity by having above mentioned oxynitride as the main component. Particularly, the specific permittivity is significantly improved in wide range of frequency of 1 kHz to 1 MHz, compared to the case of which the main component is made of oxide of barium titanate, and oxide of barium calcium titanate zirconate.

The production method of the thin film capacitor according to the present embodiment is same as the first embodiment.

Hereinabove, the embodiments of the present invention were explained, but the present invention is not to be limited to these embodiments in any way, and the present invention can be carried out in various different embodiments within the scope of the present invention.

Note that, the capacitance element according to the present invention is the element using the dielectric property, and a capacitor, a thermistor, a filter, a diplexer, a resonator, an emitter, an antenna, a piezoelectric element, a transistor, a ferroelectric memory or so are included. The polycrystalline dielectric thin film according to the present embodiment is suitably used as the capacitance element which is demanded to have particularly small dielectric loss.

EXAMPLE

Hereinafter, the present invention will be described based on further detailed examples, but the present invention is not to be limited thereto.

Experiment 1

First, as the material of a sintered body used as the target for forming the film, $SrCO_3$ powder and $Ta_2O_5$ powder were prepared. Also, in case of substituting part of or entire Sr with Ba, $BaCO_3$ powder was prepared. In case of substituting part of Ta with Nb, $Nb_2O_5$ powder was prepared. The material powders were weighed so that the mol ratio of (Sr+Ba)/(Ta+Nb) was 1.

Next, the material powders were mixed for 16 hours by a wet ball mill using ethanol solvent.

Next, said mixed slurry was dried at 80° C. for 12 hours using a thermostat drier, and the mixture was obtained.

Next, said mixture was lightly ground in a mortar, and then placed in a ceramic crucible. Then using an electric furnace, the heat treatment was carried out under an air atmosphere at 1000° C. for 2 hours; thereby the calcined material was obtained.

Next, said calcined material was again mixed for 16 hours by a wet ball mill using ethanol solvent, and then a post-calcination slurry was obtained.

The obtained post-calcination slurry was dried at 80° C. for 12 hours using the thermostat drier, and a post-calcination mixture was obtained.

Said post-calcination mixture was added and mixed with the polyvinyl alcohol as the binder, thereby a granule was obtained. The added amount of the polyvinyl alcohol solution was 0.6 wt % with respect to 100 wt % of the ground material.

Said granule was molded into a cylindrical columnar shape having the diameter of about 23 mm, and the height of about 9 mm; thereby the molded article was obtained.

Said molded article was fired under the air atmosphere at 1400° C. for 2 hours using the electric furnace, thereby a sintered article was obtained. Further, a top face and a bottom face of said sintered article was mirror polished, and the target for forming the film having a height of 5 mm was obtained. Note that, a relative density of the target for forming the film was 96 to 98%.

The obtained target for forming the film as mentioned in above was placed to the film forming device, then Si substrate was placed by facing towards the target for forming the film. As said Si substrate, those having Pt film as the lower electrode on the surface was used.

In the experiment 1, the film was formed by PLD method so that the thickness was 200 nm. By regulating the film forming condition (a partial pressure of oxygen and a partial pressure of nitrogen or so), the composition of the oxynitride included in the polycrystalline dielectric thin film obtained at the end was controlled to have the composition of the sample numbers 1 to 13 shown in the below Table 1 and Table 2. The nitrogen radical was introduced to carry out the nitriding treatment while forming the film, thereby the polycrystalline dielectric thin film was obtained. Note that, the time for forming the film was 0.5 to 2 hours. As the specific permittivity (c), the value evaluated at the voltage of 1 Vrms/μm and the frequency of 1 MHz is shown. The upper electrode for evaluating the specific permittivity was formed by depositing Ag to the electrode having the diameter of 100 μm. Note that, the sample numbers 1, 9, and 13 are the comparative examples, and rests of the samples are the examples.

XRD pattern of the thin film sample obtained in the experiment 1 was measured by Intelligent X-ray diffractometer SmartLab made by Rigaku Corporation. It was confirmed that all of the sample numbers 1 to 13 of the experiment 1 were not an epitaxial film. Also, x, y, and z of the oxynitride included in the obtained thin film sample was quantified by photoelectron spectroscopy using PHI Quantera II™ made by ULVAC-PHI, Inc.

Also, from XRD pattern of the thin film sample obtained in the experiment 1, it was confirmed that all of sample numbers 1 to 13 of the experiment 1 were polycrystalline thin film. That is, it was confirmed that the thin film was crystallized, and formed the polycrystalline thin film. Also, it was confirmed that the obtained polycrystalline thin film was not an alignment film which is aligned with respect to a specific plane.

On the other hand, the angle θ was calculated from types of M(1) to M(4) of Table 1, and values of x, y, and z of Table 2 based on the first principle calculation. Further, the specific permittivity c at the frequency of 1 MHz was calculated from the angle θ, and the correlation between the experiment result and the calculation result was confirmed. The dielectric constant described in the table is the value obtained from experiments. In the present experiment, the example having the specific permittivity larger than 1500 which is the specific permittivity of the sample number 1 was considered good, and 1800 or larger was considered even better. The results are shown in Table 1 and Table 2.

TABLE 1

| Sample No. | M(1) | M(2) | M(3) | M(4) |
|---|---|---|---|---|
| ※1 | (Sr) | Ba | Ta | (Nb) |
| 2 | (Sr) | Ba | Ta | (Nb) |
| 3 | Sr | (Ba) | Ta | (Nb) |
| 4 | Sr | (Ba) | Ta | Nb |
| 5 | Sr | Ba | Ta | (Nb) |
| 6 | Sr | Ba | Ta | (Nb) |
| 7 | Sr | Ba | Ta | Nb |
| 8 | Sr | (Ba) | Ta | Nb |
| ※9 | Sr | Ba | Ta | (Nb) |
| 10 | Sr | Ba | Ta | (Nb) |
| 11 | Sr | Ba | Ta | (Nb) |

TABLE 1-continued $(M(1)_{1-x}M(2)_x)(M(3)_{1-y}M(4)_y)(O_{1-z}N_z)_3$

| Sample No. | M(1) | M(2) | M(3) | M(4) |
|---|---|---|---|---|
| 12 | Sr | Ba | Ta | (Nb) |
| ※13 | Sr | Ba | Ta | (Nb) |

※Comparative example
Element shown in the bracket is not actually included

TABLE 2

$(M(1)_{1-x}M(2)_x)(M(3)_{1-y}M(4)_y)(O_{1-z}N_z)_3$

| Sample No. | x | y | z | θ/deg. | ε(1 MHz) |
|---|---|---|---|---|---|
| ※1 | 1 | 0 | 0.2 | *0.4* | *1500* |
| 2 | 1 | 0 | 0.333 | 0.5 | 1880 |
| 3 | 0 | 0 | 0.333 | 1.9 | 3740 |
| 4 | 0 | 0.01 | 0.333 | 1.8 | 3500 |
| 5 | 0.4 | 0 | 0.2 | 1.7 | 3250 |
| 6 | 0.8 | 0 | 0.2 | 4.6 | 3400 |
| 7 | 0.2 | 0.2 | 0.1 | 1.0 | 2360 |
| 8 | 0 | 0.4 | 0.1 | 0.8 | 2020 |
| ※9 | 0.2 | 0 | *0* | *0.0* | *40* |
| 10 | 0.2 | 0 | 0.1 | 1.0 | 2590 |
| 11 | 0.2 | 0 | 0.2 | 1.4 | 2880 |
| 12 | 0.2 | 0 | 0.3 | 2.2 | 3410 |
| ※13 | 0.2 | 0 | *0.4* | 2.5 | *680* |

※Comparative example

According to Table 1 and Table 2, each example having $0<z<1/3$ and θ of 0.5° or more and 12° or less exhibited high specific permittivity which was larger than 1500 at the frequency of 1 MHz.

Experiment 2

The sample numbers 14 and 15 which used Ca as M(2), and the sample numbers 16 and 17 which used La as M(2) and Ti as M(4) were produced same as the experiment 1. As the material of the sintered article used as the target for forming the film, $CaCO_3$ powder was prepared in case of using Ca as M(2). In case of using La as M(2), $La_2O_3$ powder was prepared. In case of using Ti as M(4), $TiO_2$ was prepared.

XRD pattern of the thin film sample obtained in the experiment 2 was measured, and was confirmed that all of the sample numbers 14 to 17 of the experiment 2 were not an epitaxial film. Also, x, y, and z of the oxynitride included in the obtained thin film sample was quantified as same as the experiment 1.

Also, from XRD pattern of the thin film sample obtained in the experiment 2, it was confirmed that all of sample numbers 14 to 17 of the experiment 2 were polycrystalline thin film. That is, it was confirmed that the thin film was crystallized, and formed the polycrystalline thin film. Also, it was confirmed that the obtained polycrystalline thin film was not an alignment film which is aligned with respect to a specific plane.

On the other hand, the angle θ was calculated from types of M(1) to M(4) of Table 3, and values of x, y, and z of Table 4 based on the first principle calculation. Further, the specific permittivity c at the frequency of 1 MHz was calculated from the angle θ, and the correlation between the experiment result and the calculation result was confirmed. In the present experiment, the example of exceeding the specific permittivity of 1500 which is the specific permittivity of the sample number 1 was considered good. The results are shown in Table 3 and Table 4.

TABLE 3

| Sample No. | (M(1)1 − xM(2)x)(M(3)1 − yM(4)y)(O1 − zNz)3 | | | |
|---|---|---|---|---|
| | M(1) | M(2) | M(3) | M(4) |
| 14 | Sr | Ca | Ta | Nb |
| 15 | Ba | Ca | Ta | Nb |
| 16 | Sr | La | Ta | Ti |
| 17 | Sr | La | Nb | Ti |

TABLE 4

| Sample No. | (M(1)1 − xM(2)x)(M(3)1 − yM(4)y)(O1 − zNz)3 | | | | |
|---|---|---|---|---|---|
| | x | y | z | θ/deg. | ε(1 MHz) |
| 14 | 0.05 | 0.2 | 0.1 | 0.8 | 1680 |
| 15 | 0.05 | 0.2 | 0.1 | 1.2 | 1560 |
| 16 | 0.2 | 0.2 | 0.1 | 2.3 | 1800 |
| 17 | 0.2 | 0.2 | 0.1 | 2.7 | 1710 |

According to Table 3 and Table 4, each example having $0<z<\frac{1}{3}$ and θ of 0.5° or more and 12° or less exhibited high specific permittivity which was larger than 1500 at the frequency of 1 MHz.

NUMERICAL REFERENCE

1 ... Thin film capacitor
11 ... Substrate
12 ... Lower electrode
13 ... Polycrystalline dielectric thin film
14 ... Upper electrode
21 ... $SrTaO_2N$ compound
22 ... Sr atom
23 ... Ta atom
24a ... O atom
24b ... N atom
31 ... Octahedron structure
33 ... Center atom
34a1 ... 4a site O atom
34a2 ... 4a site N atom

The invention claimed is:

1. A polycrystalline dielectric thin film comprising a main component made of an oxynitride expressed by a general formula of $(Sr_{1-x}Ba_x)(Ta_{1-y}Nb_y)(O_{1-z}N_z)_3$, wherein $0.02 \leq x \leq 0.8$, $0 \leq y \leq 0.4$, and $0.033 \leq z \leq 0.233$ are satisfied, and said oxynitride is a perovskite type oxynitride.

2. A capacitance element including the polycrystalline dielectric thin film as set forth in claim 1.

* * * * *